United States Patent [19]

Mason et al.

[11] 4,109,294
[45] Aug. 22, 1978

[54] MOUNTING ENCLOSURE FOR KEY TELEPHONE UNIT CIRCUIT SECTIONS

[75] Inventors: John Richard Mason, Thousand Oaks; Arthur L. Foreman, Newhall, both of Calif.

[73] Assignee: Dracon Industries, Chatsworth, Calif.

[21] Appl. No.: 755,542

[22] Filed: Dec. 30, 1976

[51] Int. Cl.² .................................................. H02B 1/00
[52] U.S. Cl. ........................................ 361/399; 361/415; 361/386; 361/394
[58] Field of Search ................ 361/386, 387, 389, 415, 361/380, 393, 394, 399; 174/50, 52 R

[56] References Cited

U.S. PATENT DOCUMENTS

| | | | |
|---|---|---|---|
| 3,052,821 | 9/1962 | Scoville | 361/399 X |
| 3,206,646 | 9/1965 | Relation et al. | 361/387 X |
| 3,258,649 | 6/1966 | Arguin et al. | 361/415 X |
| 3,265,935 | 8/1966 | Rosa | 361/415 |
| 3,360,689 | 12/1967 | Haury | 361/399 |
| 3,386,012 | 5/1968 | Seelig | 361/399 |
| 3,780,353 | 12/1973 | Gordon et al. | 174/52 R X |
| 3,952,142 | 4/1976 | Weiss | 174/52 R |

*Primary Examiner*—J D Miller
*Assistant Examiner*—Peter S. Wong

*Attorney, Agent, or Firm*—Flehr, Hohbach, Test, Albritton & Herbert

[57] ABSTRACT

A front extrusion having a generally U-shape provides top and bottom walls for the enclosure with a front wall extending therebetween. Integral extruded flanges are formed on the outer surfaces of the top and bottom walls and fastener channels are extruded on the inner surfaces of the top and bottom walls near the ends thereof as well as on the inner surfaces at the junction of the top and bottom walls with the front wall. Circuit board grooves are formed on the inner surfaces of the top and bottom walls and a shaped rear-cover groove is formed internally at the free end of each of the top and bottom walls. A rear cover which may be a plate or a rear cover extrusion is inserted laterally in the rear cover groove and trapped therein by left and right side plates which complete the enclosure. Each of the side plates has a hole pattern therein aligned with the fastener channels in the body extrusion. If the rear extrusion is utilized additional fastener channels are extruded therein and the pattern of holes in the left and right side plates is such as to align with the fastener channels in the body extrusion and the rear cover extrusion. The left side plate may alternately be a planar member or a finned heat sink having a planar surface thereon to receive high power dissipation key telephone unit circuit section components.

14 Claims, 3 Drawing Figures

U.S. Patent  Aug. 22, 1978  4,109,294
FIG.—1
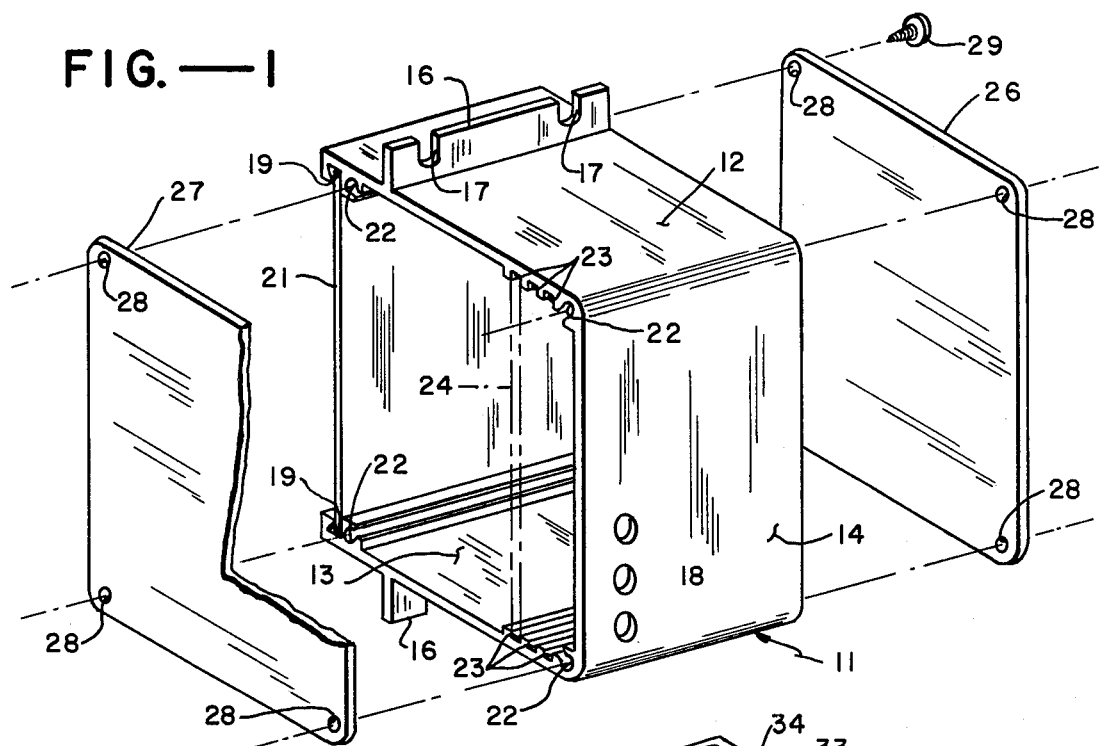
FIG.—2
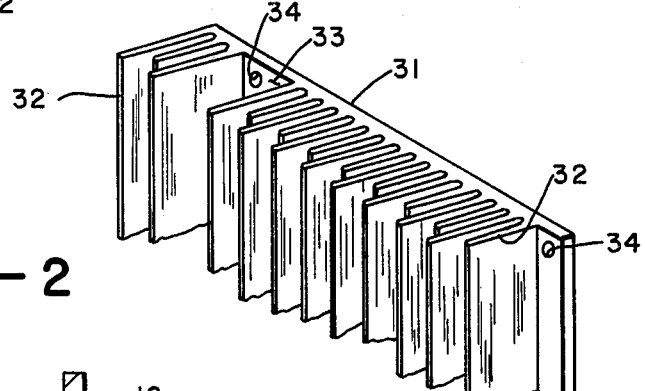
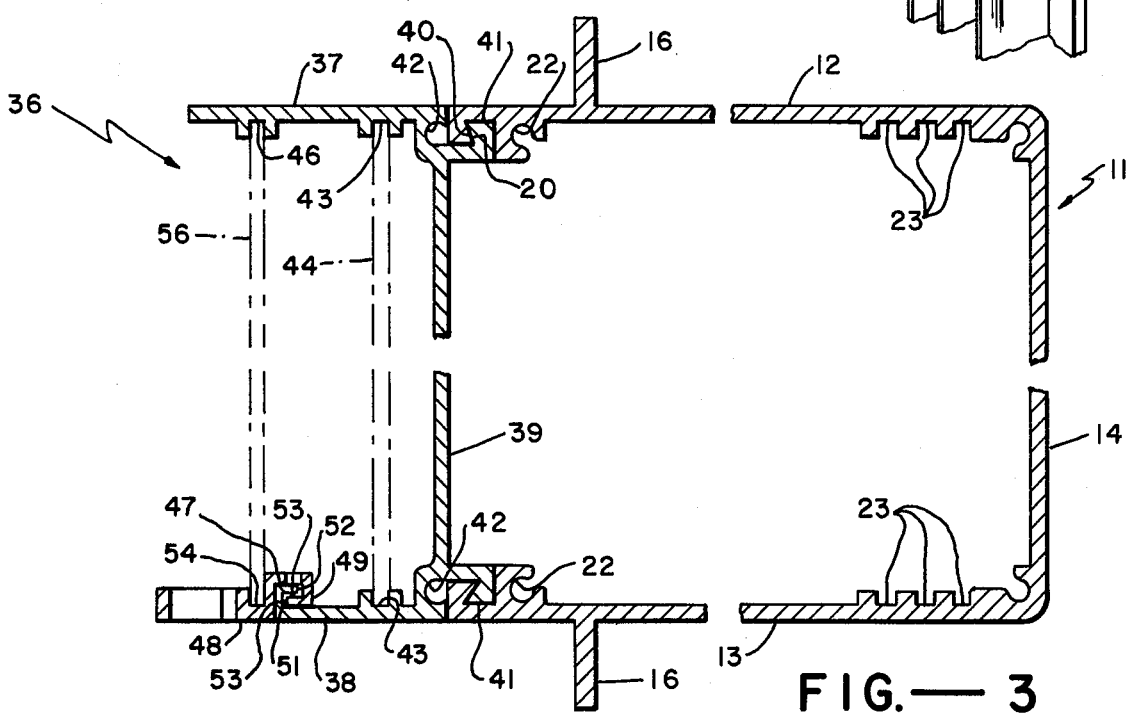
FIG.—3

MOUNTING ENCLOSURE FOR KEY TELEPHONE UNIT CIRCUIT SECTIONS

BACKGROUND OF THE INVENTION

This invention relates to a standard enclosure for electric circuit components, and more particularly to such an enclosure for key telephone unit circuit sections.

Key telephone unit circuit sections are contained in enclosures for mounting in confined spaces and generally have standard mounting configurations and well defined enclosure dimensions. The single variable among different enclosures for different key telephone unit circuit sections is generally the enclosure width. In the past a wide variety of sheet metal formed front covers, top covers, bottom covers and rear covers having different widths were required to be maintained in stock so that enclosures for specific key telephone unit circuit sections could be offered by manufacturers with a minimum of lead time delays to the user. Moreover, sheet metal forming of discreet enclosure surfaces is a relatively expensive process and requires expensive tooling as well as a great number of fasteners for securing each cover surface to the adjacent cover surfaces.

A structure for and method of forming a wide variety of key telephone unit circuit section enclosures is desirable, which provides quick fabrication of enclosures of various widths, wherein enclosure and circuit assembly requires reduced assembly effect and time.

SUMMARY AND OBJECTS OF THE INVENTION

A mounting enclosure for circuit sections having relatively standard dimensions apart from enclosure widths is disclosed herein including a main body unit extrusion having a generally U-shape providing an enclosure top and bottom and an enclosure front connected therebetween. Integral upper and lower exterior mounting flanges are extruded on the enclosure top and bottom surfaces respectively and a shaped channel is formed in the main body unit extrusion at the free ends of each of the top and bottom enclosure portions. A rear cover is formed to fit in and extend between the shaped channels being trapped therein by first and second side covers positioned at the edges of the main body unit extrusion. The interior surfaces of the main body unit extrusion have formed thereon spaced fastener channels and the side covers each have a pattern of holes therethrough aligned with the fastener channels. Fasteners passing through the holes engage the walls of the fastener channels thereby retaining the side covers in place. The rear cover may also be an extrusion having structure mating with the shaped rear cover channels and additional fastener channels aligned with the pattern of holes through the side covers. A particular enclosure width may be selected by cutting a corresponding length of the body unit extrusion and rear cover or rear extrusion.

In general it is an object of the present invention to provide a circuit section enclosure which is generally standard in outline dimensions except for enclosure width.

Another object of the present invention is to provide a circuit section enclosure with a selectable rear cover configuration to meet the requirements of the specific circuit section.

Another object of the present invention is to provide a circuit section enclosure which is capable of assembly with a minimum number of fasteners.

Another object of the present invention is to provide a circuit section enclosure for which external parts are readily formed from standard stock.

Additional objects and features of the invention will appear from the following description in which the preferred embodiments have been set forth in detail in conjunction with the accompanying drawings.

BRIEF DESCRIPTION OF THE DRAWINGS

FIG. 1 is an isometric exploded view of one embodiment of the disclosed enclosure.

FIG. 2 is an isometric view of a heat sink configuration for one side of the enclosure.

FIG. 3 is a side elevational sectional view of another embodiment of the disclosed enclosure.

DESCRIPTION OF THE PREFERRED EMBODIMENTS

A novel universal telephone circuit enclosure is hereinafter disclosed for use with various power supply and control circuits for telephone systems. Referring to FIG. 1 of the drawings, one embodiment of the new enclosure is shown in exploded view having a generally U-shaped main body extrusion 11 which includes an upper wall 12, a lower wall 13 and a front wall 14 extending therebetween. A mounting flange 16 extending in the direction of the extrusion is formed on the exterior surface of the upper wall 12 and lower wall 13. A pair of notches 17 are shown formed in mounting flange 16 for receiving fasteners (not shown) therethrough for mounting the universal telephone circuit enclosure in place at an installation. Front wall 14 has formed therein a plurality of holes 18 in a predetermined pattern to afford access to internal components for adjustment, or for visual indication of circuitbreaker condition and reset, for example, when the circuit contained in the universal enclosure includes adjustable circuit components or circuit-breaker components.

A shaped channel 19 is formed at the inwardly facing ends of upper and lower walls 12 and 13, which serves to receive a rear cover such as plate 21. Shaped channel 19 has an inclined surface 20 therein. A plate 21 has a height extending between channels 19 and is slipped into channels 19 from the sides thereof to provide a rear cover for the universal key telephone unit circuit section enclosure. U-shaped main body extrusion 11 also has a number of fastener channels 22 extending in the extrusion direction along the inner faces of upper and lower walls 12 and 13 as well as at the junction of upper and lower walls 12 and 13 with front wall 14. A plurality of facing grooves 23 are also formed on the inner surfaces of upper and lower walls 12 and 13 for holding a number of circuit boards 24 as shown in dashed lines which extend between facing grooves 23 and are inserted therein from the sides thereof.

A right side plate 26 and a left side plate 27 are shown each having a pattern of holes 28 therein which are aligned with fastener channels 22 in U-shaped main body extrusion 11. Fasteners 29 are formed to pass through holes 28 to engage the walls of fastener channels 22 and to secure right and left side plates 26 and 27 to the right and left edges respectively of U-shaped main body extrusion 11. In this fashion right and left side plates 26 and 27 trap rear plate 21 in shaped channel 19 and any circuit boards 24 in facing grooves 23.

Turning now to FIG. 2, an alternate to left side plate 27 is shown as heat sink 31 having radiating fins 32 thereon. Heat sink 31 also has a planar surface 33 which may be used to mount high power dissipation circuit components (not shown), so that the heat generated thereby may be radiated from the enclosure and will not collect therein with consequent detrimental effect. A plurality of holes 34 are formed in heat sink 31 which form a pattern such that individual holes 34 are aligned with individual ones of the fastener channels 22 in U-shaped main body extrusion 11.

Another embodiment of the novel universal key telephone unit circuit enclosure is shown in FIG. 3 wherein U-shaped main body extrusion 11 is shown in a section taken orthogonally to the direction of extrusion. Like item numbers in FIG. 3 refer to like structural members seen in FIG. 1. A rear extrusion 36 is seen in FIG. 3 which has formed thereon an upper rear extension 37 and a lower rear extension 38 with a rear plate 39 extending therebetween. A shaped tongue member 41 extends in the extrusion direction along each of the upper and lower edges of the rear extrusion 36. Shaped tongue member 41 has an inclined surface 40 thereon. The shaped tongue member 41 is configured to fit within shaped channel 19 at the ends of upper and lower walls 12 and 13 on U-shaped main body extrusion 11. In this fashion rear extrusion 36 may be inserted from the side of U-shaped main body extrusion 11 so that shaped tongue members 41 enter shaped channels 19 with inclined surfaces 20 and 40 adjacent to one another. Thus rear extrusion 36 forms a rear cover for the enclosure. Additional fastener channels 42 are seen extending parallel to shaped tongue members 41 and adjacent to the end surfaces of the rear extrusion 36. The additional fastener channels 42 are configured to receive additional fasteners similar to fasteners 29. Thus, when rear extrusion 36 is used as the rear cover for the enclosure disclosed herein, a pattern of holes 34 in the heat sink of FIG. 2 and/or patterns of holes 28 in right and left side plates 26 and 27 are such as to align with individual ones of the additional fastener channels 42 and those of the fastener channels 22 which are located at the junction between upper and lower walls 12 and 13 with front wall 14 on U-shaped main body extrusion 11. It may be seen that when fasteners 29 are inserted into additional fastener channels 42 they bear not only against the walls of channels 42, but also against the surfaces on the ends of U-shaped main body extrusion 11. As a consequence, inclined surfaces 20 and 40 are forced tightly together. Initial looseness in the fit between shaped tongue member 41 and shaped channel 19 due to extrusion forming tolerances is therefore allowable. The force created between inclined surfaces 20 and 40 further provides strength to the final assembly of parts which is principally seen in a marked resistance to torsional deformation in the assembled enclosure.

Rear extrusion 36 also has grooves 43 formed on the inwardly facing surfaces of upper and lower rear extensions 37 and 38. A circuit board 44, shown in dashed lines, having a height sufficient to extend between grooves 43 may be inserted therein from the sides thereof. Circuit board 44 is retained in grooves 43 by appropriate side plates 26 and and 27 or 26 and 31 to thereby provide additional mounting surfaces for circuits associated with the specific key telephone unit enclosure being assembled. Additional groove 46 is formed on the inwardly facing surface of upper rear extension 37 for a purpose hereinafter discussed, and a tongue and groove member 47 is formed in the extrusion direction on the end of lower rear extension 38.

Tongue and groove member 47 forms a fanning strip groove. A fanning strip 48 has a matching tongue and groove member 49 thereon which is formed to slidably fit into tongue and groove member 47 on rear extrusion 36 from the side thereof. Matching tongue and groove member 49 has faces 51 and 52 formed thereon with protrusions 53 extending therefrom. Fanning strip 48 is fabricated of some deformable material such as a plastic, so that when matching tongue and groove member 49 is slidably engaged with tongue and groove member 47, protrusions 53 on faces 51 and 52 of matching tongue and groove member 49 are deformed to thereby frictionally retain fanning strip 48 in position on lower rear extension 38 of rear extrusion 36. Fanning strip 48, retained in position as described, serves to separate cables entering and exiting the novel universal telephone circuit enclosure as well as to provide strain relief therefor. Moreover, fanning strip 48 has formed therein a slot 54 which is aligned with and facing additional groove 46 in upper rear extension 37 on rear extrusion 36. In this fashion another board or boardlike member 56 shown in dashed lines having a height sufficient to extend between groove 46 and slot 54 is assembled on the enclosure when required by the specific telephone circuit.

It should be noted that the key telephone unit circuit section enclosure disclosed herein may be assembled sections of U-shaped main body extrusion 11, a rear plate 21 or rear extrusion 36, and, when a rear extrusion 36 is utilized, a fanning strip 48, all having substantially the same length to thereby afford a circuit enclosure having a predetermined width as required by the specific circuit enclosed therein. Subsequently appropriate right and left side plates 26 and 27 or 26 and 31 are assembled to the edges of the U-shaped main body extrusion 11 trapping the appropriate rear enclosure member rear plate 21 or rear extrusion 36 therebetween. The side plates are retained by fasteners 29 which engage the walls of the appropriate fastener channels 22 and/or additional channel fasteners 42. Fasteners 29 are preferably the thread forming type which firmly engage the walls of the fastener channels 22 and 42. Thread forming screws 29 characteristically do not cut material from the walls of the fastener channels. Screws 29 displace the material at the walls of fastener channels 22 and 42 and therefore do not cast chips from the walls into the volume within the extrusions 11 and 36 containing electrical circuitry.

A novel universal key telephone unit circuit enclosure has been disclosed including easy to form and inexpensive extruded external enclosure parts. The extrusion sections may be cut to predetermined lengths thereby defining the widths of the various telephone circuit package. In this fashion a more readily assembled key telephone circuit section enclosure is made using a minimal number of fasteners and requiring a minimum amount of assembly time. Such telephone unit circuits envisioned as being contained in the disclosed enclosure include, but are not limited to, the touch-tone converter, the dial intercom, the ringing generator, the voice activated switch and the key telephone power supply.

What is claimed is:

1. A key telephone unit circuit mounting enclosure comprising:

a main body unit extrusion, said main body unit being U-shaped and including integral top, bottom, and front walls, upwardly and downwardly extending upper and lower mounting flanges integral with said main body unit extrusion top and bottom walls respectively, a rear cover adapted to fit between the free ends of said enclosure top and bottom walls, said free ends of said top and bottom walls each having a shaped channel for receiving a corresponding edge of said rear cover, said main body unit further having a plurality of fastener channels spaced around the inwardly facing surfaces, first and second side covers adapted to be secured to opposite edges of said main body unit to hold said rear cover therebetween, said first and second side covers having a pattern of holes therethrough aligned with ones of said plurality of fastener channels, a plurality of fasteners formed to pass through said holes to engage said fastener channels to be retained therein to thereby secure said first and second side covers in place, and a plurality of facing grooves integral with the top and bottom walls of said enclosure for receiving the edges of associated circuit boards to hold the same in said enclosure.

2. A mounting enclosure as in claim 1 wherein said rear cover comprises a rear extrusion including an upper rear extension and a lower rear extension and a rear plate extending therebetween, a shaped tongue member extending along each of the upper and lower edges of said rear extrusion formed to fit in said shaped channel, said rear extrusion having additional fastener channels extending along each of the upper and lower edges of said rear extrusion adjacent to said shaped tongue member, ones in said pattern of holes being aligned with said additional fastener channels and additional fasteners formed to pass through said ones in said pattern of holes engaging the sides of said additional fastener channels to be retained therein.

3. A mounting enclosure as in claim 2 wherein said shaped tongue member and said shaped channel each have inclined surfaces, said additional fastener channels having walls formed by an extruded channel in said rear extrusion and the ends of said main body unit, said inclined surfaces being forced into engagement by said additional fasteners as they engage and force apart the walls of said additional fastener channels.

4. A mounting enclosure as in claim 2 wherein said lower rear extrusion includes a fanning strip groove, together with a fanning strip, and means for mating with said fanning strip groove on said fanning strip, whereby cables entering and exiting the enclosure are separated and stress relieved.

5. A mounting enclosure as in claim 4 together with deformable means on said means for mating, whereby said fanning strip is retained in said fanning strip groove by a high friction level therebetween.

6. A mounting enclosure as in claim 4 wherein said upper rear extension has a first circuit board groove extending thereacross and said fanning strip has formed therein an opposing second circuit board groove facing said first circuit board groove, whereby a circuit board having a length sufficient to extend between said first and second circuit board grooves may be retained therein.

7. A mounting enclosure as in claim 4 wherein said upper and lower rear extensions have formed opposing first and second grooves therein respectively, whereby a circuit board having a length sufficient to extend therebetween may be retained therein.

8. A mounting enclosure as in claim 1 wherein said first side cover comprises a heat sink.

9. A mounting enclosure as in claim 8 wherein said heat sink has a plurality of fins extending therefrom for radiating heat therefrom and a planar surface thereon, so that when high heat generating circuit components are mounted on said planar surface heat is radiated from said plurality of fins.

10. A mounting enclosure for a high power dissipation electrical circuit, comprising:

a U-shaped body extrusion having a top, bottom and front wall, said body extrusion including outwardly extending mounting flanges on said top and bottom walls, rear facing cover grooves in said top and bottom walls, opposed facing interior circuit board retaining grooves in said top and bottom walls, and spaced fastener channels on the interior of said U-shaped extrusion, a rear cover extrusion having a length substantially the same as said enclosure width and a height equal to the height of said front wall, means for mating said facing rear cover grooves with each side of said rear cover extrusion, whereby said rear cover is retained in said rear cover grooves, said rear cover extrusion having additional fastener channels extending parallel to said means for mating, a first side cover, said first side cover operating as a heat sink, means for mounting high power dissipation circuit components on said first side cover, a second side cover, said first and second side covers each having a pattern of holes therein aligned with said spaced and additional fastener channels, and a plurality of fastening screws formed to pass through said holes and engaging the walls of said spaced and additional fastener channels, thereby securing said first and second side covers in position.

11. A mounting enclosure as in claim 10 wherein said means for mating includes an external surface, an internal surface in each of said rear cover grooves contacting said external surface, said body extrusion having surfaces thereon forming an extension of the walls of said additional fastener channels, whereby said fastening screws force said rear and body extrusions apart and said external and internal surfaces together so that torsional deformation in the mounting enclosure is resisted.

12. A mounting enclosure as in claim 10 together with a fanning strip, means for retaining said fanning strip on said rear cover extrusion, and means on said fanning strip for mating with said means for retaining.

13. A mounting enclosure as in claim 12 together with a plurality of protrusions on said means for mating, said protrusions being deformable, whereby said fanning strip is frictionally retained on said rear cover extrusion.

14. A mounting strip enclosure as in claim 10 wherein said exterior mounting flanges have openings punched therein to receive mounting fasteners, and said front wall has a plurality of apertures punched therein thereby providing access to a plurality of circuit breakers associated with the high power dissipation electrical circuit.

* * * * *